United States Patent [19]

Canestaro et al.

[11] 4,431,685
[45] Feb. 14, 1984

[54] DECREASING PLATED METAL DEFECTS

[75] Inventors: Michael J. Canestaro, Endicott; Donald G. McBride; John A. Welsh, both of Binghamton, all of N.Y.

[73] Assignee: International Business Machines Corporation, Armonk, N.Y.

[21] Appl. No.: 394,588

[22] Filed: Jul. 2, 1982

[51] Int. Cl.$^3$ .............................................. G03C 5/00
[52] U.S. Cl. ...................................... 427/89; 427/98; 427/125
[58] Field of Search ............................ 427/98, 89, 125

[56] References Cited

U.S. PATENT DOCUMENTS

| | | |
|---|---|---|
| 2,758,074 | 8/1956 | Black et al. . |
| 2,938,805 | 5/1960 | Agens . |
| 2,996,408 | 8/1961 | Lukes . |
| 3,075,855 | 1/1963 | Agens . |
| 3,075,856 | 1/1963 | Lukes . |
| 3,162,512 | 12/1964 | Robinson ............................. 427/98 |
| 3,448,089 | 6/1969 | Celeste . |
| 3,469,982 | 9/1969 | Celeste . |
| 3,520,683 | 7/1970 | Kerwin . |
| 3,526,504 | 9/1970 | Celeste . |
| 3,549,368 | 12/1970 | Collins et al. . |
| 3,582,415 | 6/1971 | Gulla . |
| 3,585,010 | 6/1971 | Luce et al. . |
| 3,645,772 | 2/1972 | Jones . |
| 3,672,938 | 6/1972 | Zeblisky ............................... 427/98 |
| 3,687,718 | 8/1972 | Morrison . |
| 3,694,250 | 9/1972 | Grunwald et al. ................... 427/98 |
| 3,708,329 | 1/1973 | Schoenberg .......................... 427/98 |
| 3,816,317 | 6/1974 | MacArthur et al. . |
| 3,827,908 | 8/1974 | Johnson et al. . |
| 3,844,799 | 10/1974 | Underkofler et al. . |
| 3,918,926 | 11/1975 | Wolski et al. . |
| 3,998,601 | 12/1976 | Yates et al. . |
| 4,027,055 | 5/1977 | Schneble .............................. 427/98 |
| 4,049,481 | 9/1977 | Morisaki . |
| 4,061,837 | 12/1977 | Hutkin . |
| 4,075,757 | 2/1978 | Malm et al. . |
| 4,131,517 | 12/1978 | Mitsuo et al. . |
| 4,152,467 | 5/1979 | Alpaugh et al. . |
| 4,194,913 | 3/1980 | Davis ................................... 427/98 |
| 4,301,233 | 11/1981 | Calviello ............................. 427/89 |

Primary Examiner—John H. Newsome
Attorney, Agent, or Firm—Pollock, Vande Sande & Priddy

[57] ABSTRACT

A method of decreasing plated metal defects by applying a layer of a noble metal such as palladium, platinum, gold, iridium, rhodium, or mixtures thereof between a photoresist and a metallic surface.

16 Claims, No Drawings

DECREASING PLATED METAL DEFECTS

DESCRIPTION

1. Technical Field

The present invention is concerned with a method for decreasing plated metal defects and particularly directed to decreasing defect levels of metal conductive lines. The present invention is particularly useful in the preparation of integrated circuit modules and especially high density circuit boards.

2. Background Art

In the fabrication of various articles, it is often necessary to protect preselected areas of the surface while other areas of that same surface are exposed to particular treatments and/or process procedures. For instance, one widely employed process to prepare patterned metal surfaces for use in integrated circuit boards or carriers is to apply to the metal surface, preferably to a copper surface, a photoresist material. The photoresist can be applied, for instance, by laminating a dry film of the photoresist to the surface. The layer of resist material is then selectively exposed to the desired pattern by a known technique, such as ultraviolet light, electron beam, or X-ray beam technique followed by removal of the exposed portions in the case of positive-resist materials and unexposed portions in the case of negative-resist materials by etching or dissolution in an appropriate liquid. Next, the metal surface is plated with a metal which is deposited on those areas of the metal surface which are not protected by the patterned photoresist material. When an appropriate thickness of metal has been deposited, the photoresist may be removed, leaving behind a patterned metal conductive surface. If a conductive pattern is desired, as when the photoresist is applied to an insulating board thinly clad with copper, the thin copper metal areas protected from access from the plating bath may now be etched away.

In many instances satisfactory materials are available for use of photoresists which form a smooth, pinhole-free impermeable layer on the surface of the metal to be protected.

However, problems with improperly plated lines occur particularly when the plating process is an electroless process requiring relatively long residence time in the plating bath. For instance, defects such as nicks in the lines and plating voids occur sometimes. This, in turn, results in defective printed circuit boards which must be discarded.

Attempts have been suggested for reducing such defects. For instance, methods for improving the adhesion of the photoresist layers to metallic surfaces have been provided. An example of such is suggested in U.S. Pat. No. 3,645,772.

In addition, scrubbing copper surfaces with pumice to promote better adhesion has been carried out. However, scrubbing with pumice is not entirely satisfactory, since the scrubbing operation leaves residual pumice on the copper surface and also leaves a variable surface morphology.

DISCLOSURE OF INVENTION

The present invention is concerned with a method for decreasing plated metal defects. The method includes depositing onto a metallic surface, a noble metal, and then applying a photoresist layer onto the resulting coated metallic substrate.

The metallic surface is of a different metal than the noble metal deposited thereon and is not a noble metal.

BEST AND VARIOUS MODES FOR CARRYING OUT INVENTION

The surfaces which are treated according to the present invention can be any metallic surface which is subject to chemical attack by exposure to plating baths employed to provide the conductive patterns. The metallic surfaces can be a metal per se, mixtures of metals, or alloys of various metals. Examples of metallic surfaces which can be treated according to the present invention include copper, nickel, iron, and steel. The preferred surface is copper and/or a copper alloy such as bronze or brass.

An example of a copper surface is obtained from a copper foil of the type suggested in U.S. Pat. Nos. 3,918,926; 3,998,601, and 4,075,757; disclosures of which are incorporated herein by reference. For instance, the copper foil contains an electro-deposited copper support layer and a second electro-deposited copper layer of a thickness which is not self-supporting, such as about 2 to about 12 microns. Also, the foil can include a release layer such as chromium, which remains with the support layer. A typical commercial foil includes a support layer which weighs about 2 ounces/ft$^2$ and includes as the second non-supporting copper layer about 5 microns of copper. In addition, a chromium interface is present between the support and nonsupporting copper layers. Furthermore, as available, the outer surface of the thin non-supporting copper layer is treated with zinc chromate. The zinc chromate treated layer is placed facing down on a dielectric substrate and is laminated thereto. The dielectric substrate material includes both thermoplastic and thermosetting polymers. Typical thermosetting polymeric materials to which the copper foil is laminated include epoxy, phenolic based materials, and polyamides. The dielectric materials may be molded articles of the polymers containing fillers and/or reinforcing agents such as glass-filled epoxy or phenolic based materials. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, and ABS polymers.

Bonding of a dielectric material substrate to the copper foil is carried out by pressing together a sheet of the dielectric substrate material and a sheet of the copper foil prepared according to the present invention with the treated surface next to or confronting the dielectric material, in a preheated laminating press at a predetermined pressure and temperature as, for example, about 260 to about 800 psi and preferably about 500 psi and about 340° F. The time of the pressing operation is variable depending upon the particular dielectric substrate material employed and the pressure employed. About 1 hour is adequate for the above conditions. The supporting copper layer is then peeled away from the nonsupporting copper layer, leaving only the thin nonsupporting copper layer on the epoxy board.

The metal compound employed in accordance with the present invention, in order to decrease defects from subsequently plated metal lines, is a noble metal and is different from the metallic substrate. Examples of some suitable noble metals are palladium, platinum, gold, iridium, and rhodium.

Mixtures of such metals, although not preferred, can be used. The preferred metals are palladium, gold, and platinum. The metals employed render the coated surface instantaneously anodic in comparison to a saturated calomel electrode (S.C.E.) when placed in an aqueous solution containing 3 grams/liter of benzotriazole.

The metals can be applied to the metallic surface in several different ways. In particular, the coating techniques for metal layers are well-known and need not be described herein in any great detail. In particular preferred aspects of the invention, the metals are applied by immersion techniques. Immersion plating techniques involve replacing a metallic surface being treated with a more noble metal.

The amount of metal applied is preferably such as to provide as thin a layer as possible and, most preferably, only a monolayer of noble metal. However, thicker layers can be provided, but such do not improve the performance of the noble metal and in certain instances, as will be discussed hereinbelow, detract somewhat from the overall efficiency, but not operativeness of the process.

The coating of the noble metal is preferably carried out at room temperature, but higher or lower temperatures can be used if desired. When employing an immersion coating technique, it is preferred to use residence times in the coating bath of about ½ to about 1 minute.

Immersion coating compositions of noble metals are well-known and need not be discussed herein in any great detail. For instance, acidic aqueous solutions containing about 0.1 to 0.2 gm/l of $PdCl_2$ or $AuCl_2$ and about 0.5% HCl are quite suitable for the purpose of the present invention.

The photoresist, which can be employed according to the present invention includes both positive and negative photoresists.

Examples of some photoresists employed according to the present invention include negative or photohardenable polymerizable compositions of the type suggested in U.S. Pat. Nos. 3,469,982; 3,526,504; and 3,448,089 disclosures of which are incorporated herein by reference. Polymers of methylmethacrylate with glycidyl acrylate and/or pentaerythitol triacrylate are commercially available from E. I. DuPont de Nemours and Company under the trade definition "Riston".

An example of another type of photoresist is based on phenol formaldehyde novalak polymers. A particular example of such is Shipley AZ1350 which is an m-cresol formaldehyde novalak polymer composition. Such is a positive resist composition and includes therein diazoketone, such as 2-diazo-1-naphthol-5-sulphonic acid ester. In such a composition, the orthodiazoketone during the photochemical reaction, is converted to a carboxylic acid. This, in turn, converts a neutralorganic soluble molecule (the phenolic polymer) to one that is readily soluble in weakly alkali aqueous developer solvents. The composition usually contains about 15% or so by weight of the diazoketone compound.

The photoresist is generally applied in thicknesses of about 1 to 4 mil. The photoresist can be applied, for instance, by lamination. The layer of resist material is then selectively exposed to the desired pattern and developed by a known technique such as ultraviolet light, electron beam, or X-ray beam technique followed by removal of the exposed portions in the case of positive-resist materials by etching or dissolution in an appropriate liquid.

In the case of the above-discussed methyl methacrylate polymers from DuPont, the unexposed portions can be removed using a trichlorethylene, tetrachloroethylene, and/or 1,1,1-trichloroethane spray.

Next, a metal such as nickel or copper is plated, preferably by electroless plating, onto those preselected areas of the dielectric substrate which do not contain the photoresist material to provide the desired circuitry. The metal is coated to the desired thickness of the circuitry such as about 1 to 2 mils. The preferred metal employed is copper. The preferred copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjuster. The plating baths also preferably include a cyanide ion source and a surface-active agent.

The cupric ion source generally used is a cupric sulfate or a cupric salt of the complexing agent to be employed.

When employing cupric sulfate, it is preferred to use amounts from about 3 to about 15 grams/liter and most preferably from about 8 to about 12 grams/liter. The most common reducing agent employed in formaldehyde, which in the preferred aspects of the present invention, is used in amounts from about 0.7 to about 7 grams per liter and most preferably, from about 0.7 to about 2.2 grams per liter. Examples of some other reducing agents include formaldehyde precursors or derivatives such as paraformaldehyde, trioxane, dimethyl hydantoin, glyoxal; borohydrides such as alkali metal borohydrides (sodium and potassium borohydride) and substituted borohydrides such as sodium trimethoxyborohydride; boranes such as amineboran (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrilotetracetic acid and its alkali salts, gluconic acid, gluconates, triethanol amine, glucono (gamma)-lactone, modified ethylene diamine acetates such as N-hydroxyethyl ethylene diamine triacetate. In addition, a number of other suitable cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 grams/liter, or in a 3-4 fold molar excess.

The plating bath can also contain a surfactant which assists in wetting the surface to be coated. A satisfactory surfactant is, for instance, an organic phosphate ester available under the trade designation Gafac RE-610. Generally, the surfactant is present in amounts from about 0.02 to about 0.3 grams/liter. In addition, the pH of the bath is also generally controlled, for instance, by the addition of a basic compound such as sodium hydroxide or potassium hydroxide in the desired amount to achieve the desired pH. The preferred pH of the electroless plating bath is between 11.6 and 11.8.

Also preferably, the plating bath also contains a cyanide ion and most preferably, contains about 10 to about 25 milligrams per liter to provide a cyanide ion concentration in the bath within the range of 0.0002 to 0.0004 molar. Examples of some cyanides which can be employed according to the present invention are the alkali metal, alkaline earth metal, and ammonium cyanide. In addition, the plating baths can include other minor additives as is well known in the prior art.

The preferred plating baths employed have a specific gravity within the range of 1.060 to 1.080. In addition, the temperature of the bath is preferably maintained between 70° and 80° C. and most preferably between 70° and 75° C. For a discussion of the preferred plating temperatures coupled with the preferred cyanide ion concentrations, see U.S. Pat. No. 3,844,799.

Also, it is preferred to maintain the $O_2$ content of the bath between about 2 ppm and 4 ppm and preferably about 2.5 to 3.5 ppm as discussed in U.S. Pat. No. 4,152,467. The $O_2$ content can be controlled by injecting oxygen and an inert gas into the bath.

The overall flow rate of the gasses into the bath is generally from about 1 to about 20 SCFM per 1000 gallons of bath and preferably from about 3 to about 8 SCFM per 1000 gallons of bath.

Although the plating of the metal such as the copper or nickel can be achieved by electrolytic coating, the advantages of the present invention are much more pronounced when an electroless coating procedure is used since electrolytic coating requires much less exposure to the coating bath than does the electroless coating procedure. The exposure to the plating baths without the treatment with a noble metal according to the present invention results in defects in the plated conductive lines such as nicks, plating voids, and corrosion of the lines.

According to the present invention, the plated lines are well formed and substantially free from the plating defects discussed hereinabove.

The treatment of the metallic surface with the noble metal, in accordance with the present invention, can be followed by treatment with benzotriazole, if desired.

Next, the plated metal lines can be protected from the subsequently to be used etchant for removal of the photoresist. For example, copper plated lines can be coated by immersion coating with tin. The tin acts as an etch resist.

The previously exposed remaining photoresist can next be removed by etching or dissolution in an appropriate liquid. For instance, in the case of the above discussed methyl methacrylate polymers from DuPont, the exposed portions of the photoresist can be removed using methyl chloroform or methylene chloride etchant.

Next, the thin copper layer uncovered which was previously beneath the exposed resist is removed by flash etching for instance, in a persulfate bath resulting in the desired metal circuitry. Since the noble metal remaining on this thin copper layer before etching is as thin as possible, the thin copper along with this noble metal, can be readily flash etched. If the noble metal layer is too thick, it can act as an etch resist thereby making removal of the thin metal between the desired plated metal lines difficult and inefficient.

The following non-limiting example is presented herein to further illustrate the present invention.

A copper foil having a 2 ounce support layer and a thin 5 micron nonsupporting layer is laminated to an epoxy-fiberglass composite. The supporting 2 ounce copper layer of the foil is then peeled away from the non-supporting 5 micron copper layer leaving the 5 micron copper layer remaining on the laminate.

Next, the copper coated epoxy-fiberglass laminate is immersed into a noble metal composition containing about 0.15 gm/l by weight of palladium chloride and about 0.5% HCl with the remainder being water. The laminate is contacted with the palladium chloride aqueous solution for about 30 seconds at room temperature and then dried.

Next, a negative photoresist obtained from a polymer of methylmethacrylate with glycidyl acrylate and pentaerythitol triacrylate commercially available from DuPont under the trade designation "Riston" is applied to the palladium coated surface. The photoresist is applied in the thicknesses of about 2.2 mil. The photoresist is then exposed to ultraviolet light in the desired pattern, and the unexposed portions are removed by spraying with trichlorethylene.

After this, copper is selectively plated onto the substrate to a thickness of about 2 mils by contacting with an electroless plating bath containing about 10 grams per liter of $CuSO_4$-$5H_2O$, 35 grams per liter of ethylene diamine tetraacetic acid dihydrate, 0.25 grams per liter of GAFAC RE-610, 14 milligrams per liter of sodium cyanide, and 2 milliliters per liter of 37% aqueous HCHO. The specific gravity of the plating bath is about 1.07, the pH is 11.7 by the addition of NaOH and the temperature of the bath is 75°±5° C. The $O_2$ content of the bath is maintained at about 2.5 to 3.5 ppm. The gas flow rate is about 12 SCFM. In addition, the plating racks are continuously agitated during the plating.

Next, the plated metal lines are then coated with tin by an immersion tin coating technique using Cuposit LT 26A ® from Shipley Corporation employing a composition containing 9% Sn in water.

The previously exposed remaining photoresist is then removed by dissolution with a methylene chloride solvent.

The thin copper layer, which was previously beneath the exposed resist, is then removed by flash etching in a persulfate bath containing about 2.5 lbs/gal sodium persulfate and by contacting at 43° C. for about 1.5 minutes.

Plated boards are then inspected for voids and the results show no voids in any plating process. The boards also exhibit good line definition.

Having thus described our invention, what we claim as new, and desire to secure by Letters Patent is:

1. A method for decreasing plated metal defects which comprises applying to a metallic surface a layer of a metal different from said metallic surface and being a noble metal, then applying a photoresist layer onto the resulting noble metal coated surface and then electrolessly plating a metal.

2. The method of claim 1 wherein said metallic surface is selected from the group of copper, nickel, iron, or steel.

3. The method of claim 1 wherein said metallic surface is copper or copper alloy.

4. The method of claim 1 wherein said metallic surface is a metal or alloy supported by a dielectric substrate.

5. The method of claim 4 wherein said metallic surface is copper.

6. The method of claim 5 wherein the copper is about 2 to about 12 microns thick.

7. The method of claims 1, 2, 3, 4, 5, or 6 wherein said noble metal is selected from the group of palladium, platinum, gold, iridium, or rhodium.

8. The method of claims 1, 2, 3, 4, 5, or 6 wherein said noble metal is selected from the group of palladium, gold, or platinum.

9. The method of claims 1, 2, 3, 4, 5, or 6 wherein the thickness of said metal layer is a monolayer.

10. The method of claims 1, 2, 3, 4, 5, or 6 wherein said noble metal is applied by immersion coating technique.

11. The method of claim 1 wherein, prior to the step of plating a metal, the photoresist is developed to expose desired portions of the underlying metallic surface for the subsequent plating of metal thereon.

12. The method of claim 11 wherein said metal is selected from the group of nickel or copper.

13. The method of claim 11 wherein said metal is electrolessly coated copper.

14. The method of claim 11 wherein the plated metal is coated with an immersion tin coating layer.

15. The method of claim 14 which further includes removing the previously unremoved photoresist material.

16. The method of claim 15 which further includes removing the thin underlying metallic surface which was protected during the plating by the photoresist.

* * * * *